(12) United States Patent
Chien

(10) Patent No.: US 11,626,573 B2
(45) Date of Patent: Apr. 11, 2023

(54) ORGANIC LIGHT EMITTING DIODE DISPLAY, METHOD OF MANUFACTURING THEREOF, AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Chinghung Chien, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 331 days.

(21) Appl. No.: 16/647,535

(22) PCT Filed: Feb. 14, 2020

(86) PCT No.: PCT/CN2020/075252
§ 371 (c)(1),
(2) Date: Mar. 16, 2020

(87) PCT Pub. No.: WO2021/142872
PCT Pub. Date: Jul. 22, 2021

(65) Prior Publication Data
US 2022/0006048 A1 Jan. 6, 2022

(30) Foreign Application Priority Data
Jan. 14, 2020 (CN) .......................... 202010035826.7

(51) Int. Cl.
*H01L 51/52* (2006.01)
*H01L 27/32* (2006.01)
(Continued)

(52) U.S. Cl.
CPC ...... *H01L 51/5253* (2013.01); *H01L 27/3234* (2013.01); *H01L 27/3246* (2013.01); *H01L 51/0005* (2013.01); *H01L 51/56* (2013.01)

(58) Field of Classification Search
None
See application file for complete search history.

(56) References Cited

U.S. PATENT DOCUMENTS

2015/0280170 A1* 10/2015 Harikrishna Mohan ............. H01L 51/5253 257/40
2017/0214003 A1 7/2017 Lee et al.
(Continued)

FOREIGN PATENT DOCUMENTS

| CN | 109119446 A | 1/2019 |
| CN | 109360840 A | 2/2019 |

(Continued)

*Primary Examiner* — Michelle Mandala
(74) *Attorney, Agent, or Firm* — PV IP PC; Wei Te Chung; Ude Lu

(57) ABSTRACT

A method of manufacturing an organic light emitting diode display panel includes: providing a substrate, and a flexible film layer is formed on the substrate; forming an anode layer on the flexible film layer, and a via hole region is disposed on the anode layer, a camera is disposed at a side of the substrate facing away from the via hole region, and an orthographic projection region of the camera on the substrate is located in the via hole region; forming a first bank and a second bank at intervals in the via hole region, and the first bank and the second bank are both located in the orthographic projection region of the via hole region; depositing a light emitting layer and a cathode layer sequentially, and the light emitting layer and the cathode layer are configured to form a light emitting unit; and packaging the display panel.

10 Claims, 2 Drawing Sheets

(51) Int. Cl.
*H01L 51/00* (2006.01)
*H01L 51/56* (2006.01)

(56) References Cited

U.S. PATENT DOCUMENTS

| | | | |
|---|---|---|---|
| 2017/0331058 A1 | 11/2017 | Seo et al. | |
| 2020/0161579 A1* | 5/2020 | Kim | ................... H01L 51/5036 |
| 2020/0194714 A1* | 6/2020 | Won | ................... H01L 51/5237 |
| 2021/0028388 A1 | 1/2021 | Jiang | |

FOREIGN PATENT DOCUMENTS

| | | |
|---|---|---|
| CN | 110364560 A | 10/2019 |
| CN | 111326553 A | 6/2020 |

* cited by examiner

```
┌─────────────────────────────────────────────────────────────────┐
│ providing a substrate, and a flexible thin film layer is formed on the substrate │──S100
└─────────────────────────────────────────────────────────────────┘
                                  ↓
┌─────────────────────────────────────────────────────────────────┐
│ forming an anode layer on the flexible film layer, and a via hole region is │
│ disposed on the anode layer, a camera is disposed at a side of the substrate │
│ facing away from the via hole region, and an orthographic projection region of │──S200
│ the camera on the substrate is located in the via hole region │
└─────────────────────────────────────────────────────────────────┘
                                  ↓
┌─────────────────────────────────────────────────────────────────┐
│ forming a plurality of first banks and a plurality of second banks at intervals in │
│ the via hole region, and the plurality of first banks and the plurality of the │
│ second banks are both located in the orthographic projection region of the via │──S300
│ hole region │
└─────────────────────────────────────────────────────────────────┘
                                  ↓
┌─────────────────────────────────────────────────────────────────┐
│ depositing a light emitting layer and a cathode layer on the anode layer │
│ sequentially, and the light emitting layer and the cathode layer are configured to │──S400
│ form a light emitting unit │
└─────────────────────────────────────────────────────────────────┘
                                  ↓
┌─────────────────────────────────────────────────────────────────┐
│ packaging the display panel │──S500
└─────────────────────────────────────────────────────────────────┘
```

FIG. 1

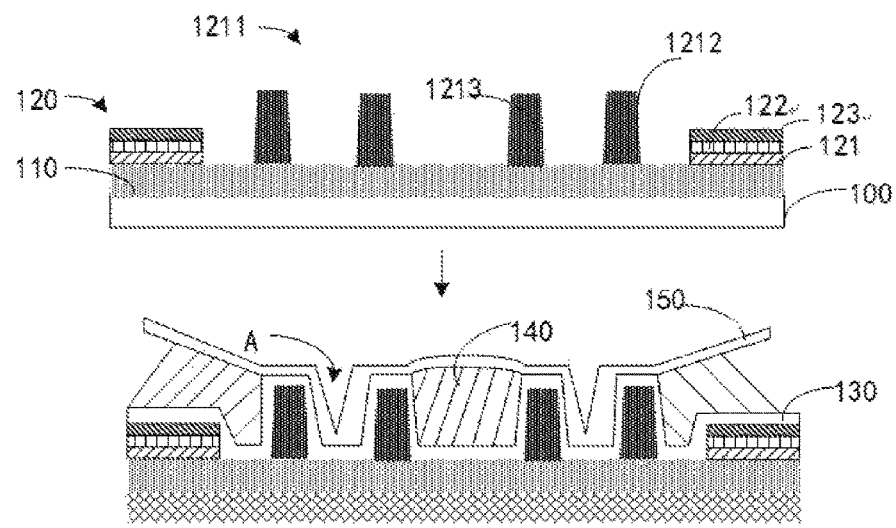

FIG. 2

ORGANIC LIGHT EMITTING DIODE DISPLAY, METHOD OF MANUFACTURING THEREOF, AND DISPLAY DEVICE

BACKGROUND OF INVENTION

Field of Invention

The present invention relates to the field of display device technology, and more particularly, to an organic light emitting diode display panel, a method of manufacturing thereof, and display device.

Description of Prior Art

Organic light emitting diode (OLED) display devices are also called organic electric laser display devices and organic light emitting semiconductors. Because the organic light emitting diode display devices have self-luminous properties, they are different from thin film transistor liquid crystal display (TFT-LCD) devices requiring a backlight, so the organic light emitting diode display devices have high visibility and brightness. In addition, the OLED display devices have advantages of low driving voltage, high energy saving efficiency, fast response times, light weight, thin, simple structure, low cost, wide viewing angle, almost infinitely high contrast, low power consumption, and extremely high response times. Currently, they have become one of the most important display technologies and are gradually replacing TFT-LCD. They are expected to become next generation of mainstream display technology following LCDs.

Currently, display devices, such as mobile phones, adopt full screens. In order to achieve selfies and video calling functions, a front camera or a physical button is usually provided in the display area of the display panel. In order to set up a front camera in the display area, it is necessary to form a via hole penetrating through the display panel in the display area of the full screen, that is to form a drilling screen.

In the prior art, in the packaging process of the drilling screen product, the photoresist not completely filled into the via hole is easy occurred, and an additional inkjet printing process is required to fill the via hole after packaging, which increases the difficulty of production and cannot achieve mass production.

SUMMARY OF INVENTION

An organic light emitting diode display panel, a method of manufacturing thereof, and a display device are provided, which solves the problem that in the packaging process of the drilling screen product, the photoresist not completely filled into the via hole is easy occurred, and an additional inkjet printing process is required to fill the via hole after packaging, which increases the difficulty of production and cannot achieve mass production.

In one embodiment, a method of manufacturing an organic light emitting diode display panel is provided. The method following steps: providing a substrate, and a flexible film layer is formed on the substrate; forming an anode layer on the flexible film layer, and a via hole region is disposed on the anode layer, a camera is disposed at a side of the substrate facing away from the via hole region, and an orthographic projection region of the camera on the substrate is located in the via hole region; forming a plurality of first banks and a plurality of second banks at intervals in the via hole region, and the plurality of first banks and the plurality of the second banks are both located in the orthographic projection region of the via hole region; depositing a light emitting layer and a cathode layer sequentially, and the light emitting layer and the cathode layer are configured to form a light emitting unit; and packaging the display panel.

In another embodiment, an organic light emitting diode display panel includes: a substrate, and a flexible film layer is formed on the substrate; a light emitting unit including an anode layer, a light emitting layer, and a cathode layer, and a via hole region is disposed on the anode layer, a camera is disposed at a side of the substrate facing away from the via hole region, and an orthographic projection region of the camera on the substrate is located in the via hole region; a first bank and a second bank, and the first bank and the second bank are formed at intervals in the via hole region, and the first bank and the second bank are both located in the orthographic projection region of the via hole region; and a packaging layer formed on the first bank, the second bank, and the light emitting unit.

In further embodiment, a display device includes: a display panel, and the display panel includes: a substrate, and a flexible film layer is formed on the substrate; a light emitting unit comprising an anode layer, a light emitting layer, and a cathode layer, and a via hole region is disposed on the anode layer, a camera is disposed at a side of the substrate facing away from the via hole region, and an orthographic projection region of the camera on the substrate is located in the via hole region; a first bank and a second bank, and the first bank and the second bank are formed at intervals in the via hole region, and the first bank and the second bank are both located in the orthographic projection region of the via hole region; and a packaging layer formed on the first bank, the second bank, and the light emitting unit.

The beneficial effect of the present invention is that, different from the prior art, an organic light emitting diode display panel, a method of manufacturing thereof, and a display device are provided. It solves a problem, which is that the photoresist cannot be complete filled into the via hole in the subsequent DOT process, by adding a plurality of second banks in the via hole region of the substrate, and there is no need to add additional inkjet printing processes, so it further simplifies processes and reduces costs.

BRIEF DESCRIPTION OF DRAWINGS

In order to more clearly illustrate the technical solutions in the embodiments, the drawings described in the description of the embodiments are briefly described below. It is obvious that the drawings in the following description are only some embodiments of the present invention. Other drawings can also be obtained from those skilled persons in the art based on drawings without any creative effort.

FIG. 1 is a schematic flowchart of a method of manufacturing an organic light emitting diode display panel according to one embodiment of the present invention.

FIG. 2 is a schematic view of a manufacturing process of an organic light emitting diode display panel according to one embodiment the present invention.

DETAILED DESCRIPTION OF PREFERRED EMBODIMENTS

Figure 3:
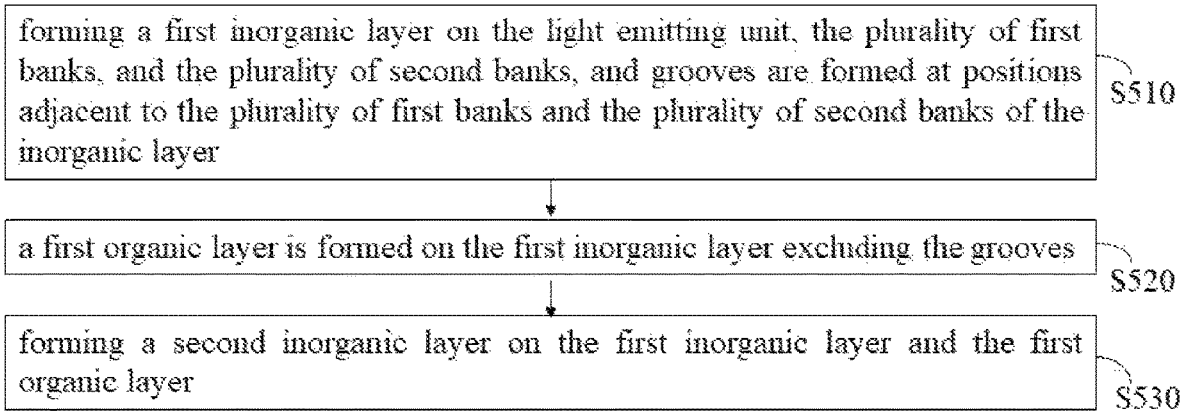
FIG. 3 is a schematic flowchart of step S500 in FIG. 1 according to one embodiment of the present invention.

In the following, the technical solutions in the embodiments of the present invention will be clearly and completely described with reference to the drawings in the embodiments of the present invention. Obviously, the described embodiments are only a part of the embodiments of the present invention, not all of the embodiments. Based on the embodiments in the present invention, all other embodiments obtained by a person of ordinary skill in the art without creative efforts shall fall within the claimed scope of the present invention.

The terms "first," "second," and "third" in this application are used for descriptive purposes only, and should not be interpreted as indicating or suggesting relative importance or implicitly indicating the number of technical features indicated. Therefore, the features defined as "first," "second," and "third" may explicitly or implicitly include at least one of the features. In the description of the present invention, the meaning of "a plurality" is at least two, for example, two, three, etc., unless it is specifically and specifically defined otherwise. All directional indicators, such as up, down, left, right, front, back, etc. in the embodiments of the present invention are only used to explain the relative positional relationship and movement between the components in a specific state as shown in the drawings. If the specific state is changed, the directional indication will be changed accordingly.

Reference to "one embodiment" herein means that a particular feature, structure, or characteristic described in connection with the embodiment may be included in at least one embodiment of the present invention. The appearances of this phrase in various places in the specification are not necessarily all referring to the same embodiment, nor are they independent or alternative embodiments that are mutually exclusive with other embodiments. It is explicitly and implicitly understood by those skilled persons in the art that the embodiments described herein may be combined with other embodiments.

Referring to FIG. 1, it is a schematic flowchart of a method of manufacturing an organic light emitting diode display panel according to one embodiment of the present invention. A method of manufacturing an organic light emitting diode display panel in FIG. 1 includes following steps:

Step S100, providing a substrate, and a flexible film layer is formed on the substrate.

Furthermore, in combination with FIG. 2, it is a schematic view of a manufacturing process of an organic light emitting diode display panel according to one embodiment the present invention. As shown in FIG. 2, a substrate 100 is provided. The substrate 100 may be a transparent material, and may be a substrate made of glass, ceramic substrate, or transparent plastic, which is not specifically limited herein. In the specific embodiment of the present invention, thin glass is used to prevent the weight of the substrate 100 from being too heavy, which may affect thickness and weight of the display panel.

Specifically, a flexible film layer 110 is also formed on the base substrate 100. In the embodiment, the flexible film layer 110 may be made of polyimide (PI), and the use of the polyimide material may not only transmit light normally, but also realize flexible deformation of the OLED display panel. Of course, in other embodiments, other flexible materials may also be used, which is not specifically limited herein.

Step S200, forming an anode layer on the flexible film layer, and a via hole region is disposed on the anode layer, a camera is disposed at a side of the substrate facing away from the via hole region, and an orthographic projection region of the camera on the substrate is located in the via hole region.

It can be understood that before forming the light emitting unit, a thin film transistor array (not shown) needs to be formed on the substrate 100. The thin film transistor array includes an active layer (not shown), a gate layer (not shown), and a source/drain layer (not shown). The formation of the thin film transistor array can refer to the conventional technical means in the prior art, which will not be further described herein.

Optionally, an anode layer 121 is formed on the flexible film layer 110. In one embodiment of the present invention, the anode layer 121 may be formed by sputtering, exposure, etching, and photoresist stripping. Generally, the anode layer 121 may be made of indium tin oxide (ITO) or a laminated structure including indium tin oxide, silver (Ag), and indium tin oxide. The anode of indium tin oxide layer is etched by strong acid such as nitric acid ($HNO_3$) or sulfuric acid ($H_2SO_4$). The anode of the laminated layer is etched by nitric acid or phosphoric acid ($H_3PO_4$) to form a patterned anode layer, that is, a via hole region 1211 is formed on the anode layer 121.

In combination with FIG. 2, a camera is disposed at a side of the substrate 100 facing away from the via hole region 1211, and an orthographic projection region of the camera on the substrate 100 is located in the via hole region 1211.

Step S300, forming a plurality of first banks and a plurality of second banks at intervals in the via hole region, and the plurality of first banks and the plurality of the second banks are both located in the orthographic projection region of the via hole region.

Furthermore, forming a plurality of first banks 1212 and a plurality of second banks 1213 at intervals in the via hole region 1211, and the plurality of first banks 1212 and the plurality of the second banks 1213 are both located in the orthographic projection region of the via hole region 1211.

Specifically, the plurality of first banks 1212 correspond to a position of a camera aperture in the orthographic projection region of the substrate 100, and the plurality of second banks 1213 are formed in the via hole region 1211 surrounded by the plurality of first banks 1212. Optionally, the plurality of first banks 1212 and the plurality of second banks 1213 may be made of photoresist materials.

Compared to the prior art, it solves a problem, which is that the photoresist cannot be completely filled into the via hole in the subsequent DOT process, by adding a plurality of second banks 1213 in the via hole region 1211, and there is no need to add additional inkjet printing processes, so it further simplifies processes and reduces costs.

Step S400, depositing a light emitting layer and a cathode layer on the anode layer sequentially, and the light emitting layer and the cathode layer are configured to form a light emitting unit.

Furthermore, depositing a light emitting layer 122 and a cathode layer 123 on the anode layer 121 sequentially, and the light emitting layer and the cathode layer are configured to form a light emitting unit 120. The light emitting layer 122 and the cathode layer 123 can be formed by a vapor deposition process. The light emitting layer 122 and the cathode layer 123 may be formed by vapor deposition.

Step S500, packaging the display panel.

In combination with FIG. 3, it is a schematic flowchart of a step S500 according to one embodiment of the present invention. The step S500 includes following steps:

Step 510, forming a first inorganic layer on the light emitting unit, the plurality of first banks, and the plurality of second banks, and grooves are formed at positions adjacent to the plurality of first banks and the plurality of second banks of the inorganic layer.

Furthermore, the first inorganic layer 130 is formed on the light emitting unit 120, the first banks 1212, and the second banks 1213 by chemical vapor deposition (CVD). The first inorganic layer 130 is used to block moisture from entering the device and prevent the device from being affected by moisture. The first inorganic layer 130 may generally be selected from one of silicon oxide, silicon nitride, and silicon oxynitride, or a combination thereof.

The grooves "A" are formed at positions adjacent to the plurality of first banks 1212 and the plurality of second banks 1213 of the inorganic layer 130.

The groove "A" may be used as a cutting line, that is, after the subsequent processes are completed, the second banks 1213 located in the via hole region 1211 are cut by laser.

Step S520, a first organic layer is formed on the first inorganic layer excluding the grooves.

Furthermore, a first organic layer 140 is formed on the first inorganic layer 130 excluding the grooves "A" by inkjet printing. The first organic layer 140 may generally be made of a high molecular polymer, which may include but is not limited to one of following materials: epoxy resin, polyethylene terephthalate (PET), polyethylene naphthalate (PEN), polystyrene (PS), polycarbonate (PC), polyimide (PI), polyethylene sulfonate, polyoxymethylene, polyarylate, acrylic, and hexamethyldisiloxane.

Step S530, forming a second inorganic layer on the first inorganic layer and the first organic layer.

Furthermore, a second inorganic layer 150 is formed on the first inorganic layer 130 and the first organic layer 140 to prevent moisture from entering the device. Optionally, it is identical to the formation of the first inorganic layer 130, the second inorganic layer 150 may also be formed by chemical vapor deposition, and the second inorganic layer 150 may be selected from one of silicon oxide, silicon nitride, or silicon oxynitride or a combination thereof.

Of course, the display panel provided in the embodiment of the present invention may further include a pixel definition layer, a planarization layer, and the like, which may be formed by referring to the prior art, and will not be described in detail herein.

Accordingly, it solves a problem, which is that the photoresist cannot be completely filled into the via hole in the subsequent DOT process, by adding a plurality of second banks in the via hole region, and there is no need to add additional inkjet printing processes, so it further simplifies processes and reduces costs.

Figure 4:
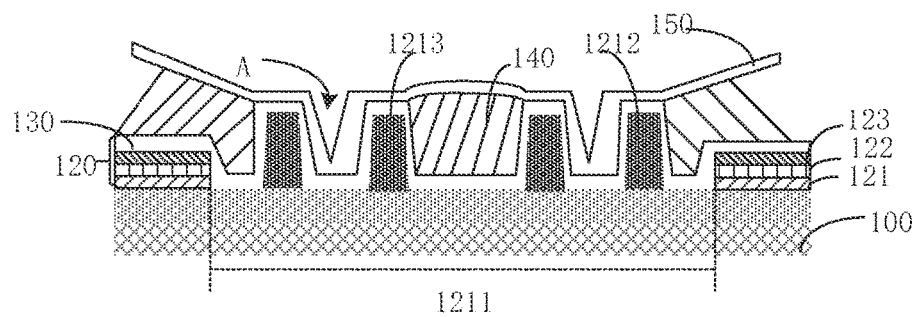
FIG. 4 is a schematic structural view of a display panel according to one embodiment of the present invention.

Referring to FIG. 4, it is a schematic structural view of a display panel according to one embodiment of the present invention. As shown in FIG. 4, the display panel provided in the present invention includes a substrate 100, a light emitting unit 120, a first bank 1212, a second bank 1213, and a packaging layer.

The substrate 100 may be made of a transparent material. In the specific embodiment of the present invention, thin glass is used to prevent the substrate 100 from overweight, which affects the thickness and weight of the display panel.

The flexible film layer 110 is formed on the substrate 100, and polyimide (PI) may be used, and the polyimide may not only transmit light normally, but also realize flexible deformation of the OLED display panel.

The light emitting unit 120 includes an anode layer 121, a light emitting layer 122, and a cathode layer 123, and a via hole region 1211 is disposed on the anode layer, a camera is disposed at a side of the substrate 110 facing away from the via hole region 1211, and an orthographic projection region of the camera on the substrate 110 is located in the via hole region 1211. It can be understood that the display panel further includes forming a substrate 110 on a thin film transistor array (not shown). The thin film transistor array includes an active layer (not shown), a gate layer (not shown), and a source/drain layer (not shown). The formation of the thin film transistor array can refer to the conventional technical means in the prior art, which will not be further described herein.

Optionally, an anode layer 121 is formed on the flexible film layer 110. In one embodiment of the present invention, the anode layer 121 may be formed by sputtering, exposure, etching, and photoresist stripping. Generally, the anode layer 121 may be made of indium tin oxide (ITO) or a laminated structure including indium tin oxide, silver (Ag), and indium tin oxide. The anode of indium tin oxide layer is etched by strong acid such as nitric acid ($HNO_3$) or sulfuric acid ($H_2SO_4$). The anode of the laminated layer is etched by nitric acid or phosphoric acid ($H_3PO_4$) to form a patterned anode layer, that is, a via hole region 1211 is formed on the anode layer 121.

Furthermore, forming a plurality of first banks 1212 and a plurality of second banks 1213 at intervals in the via hole region 1211, and the plurality of first banks 1212 and the plurality of the second banks 1213 are both located in the orthographic projection region of the via hole region 1211.

Specifically, the plurality of first banks 1212 correspond to a position of a camera aperture in the orthographic projection region of the substrate 100, and the plurality of second banks 1213 are formed in the via hole region 1211 surrounded by the plurality of first banks 1212. Optionally, the plurality of first banks 1212 and the plurality of second banks 1213 may be made of photoresist materials.

Compared to the prior art, it solves a problem, which is that the photoresist cannot be completely filled into the via hole in the subsequent DOT process, by adding a plurality of second banks 1213 in the via hole region 1211, and there is no need to add additional inkjet printing processes, so it further simplifies processes and reduces costs.

A packaging layer is formed on the first bank 1212, the second bank 1213, and the light emitting unit 120. The packaging layer includes a first inorganic layer 130, a first organic layer 140, and a second inorganic layer 150.

Furthermore, the first inorganic layer 130 is formed by chemical vapor deposition to block moisture from entering the device and prevent the device from being affected by moisture. The first inorganic layer 130 may generally be selected from one of silicon oxide, silicon nitride, and silicon oxynitride, or a combination thereof. The grooves are formed at positions adjacent to the plurality of first banks 1212 and the plurality of second banks 1213 of the inorganic layer 130. The groove may be used as a cutting line, that is, after the subsequent processes are completed, the second banks 1213 located in the via hole region 1211 are cut by laser.

A first organic layer 140 is formed on the first inorganic layer 130 excluding the grooves "A" by inkjet printing. The first organic layer 140 may generally be made of a high molecular polymer, which may include but is not limited to one of following materials: epoxy resin, polyethylene terephthalate (PET), polyethylene naphthalate (PEN), polystyrene (PS), polycarbonate (PC), polyimide (PI), polyethylene sulfonate, polyoxymethylene, polyarylate, acrylic, and hexamethyldisiloxane.

A second inorganic layer 150 is formed on the first inorganic layer 130 and the first organic layer 140 to prevent moisture from entering the device. It is identical to the formation of the first inorganic layer 130, the second inorganic layer 150 may also be formed by chemical vapor deposition, and the second inorganic layer 150 may be selected from one of silicon oxide, silicon nitride, or silicon oxynitride or a combination thereof.

The display panel provided in the embodiment of the present invention may further include a pixel definition layer, a planarization layer, and the like, which may be formed by referring to the prior art, and will not be described in detail herein.

Accordingly, it solves a problem, which is that the photoresist cannot be completely filled into the via hole in the subsequent DOT process, by adding a plurality of second banks in the via hole region, and there is no need to add additional inkjet printing processes, so it further simplifies processes and reduces costs.

Figure 5:
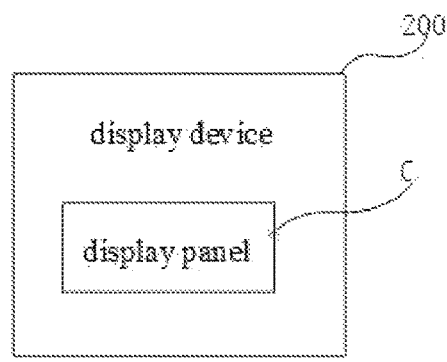
FIG. 5 is a schematic structural view of a display device according to one embodiment of the present invention.

Referring to FIG. 5, it is a schematic structural view of a display device according to one embodiment of the present invention. The display device 200 includes a display panel "C" with any of the above structures, and a method of manufacturing the display panel "C" may be referred to the specific descriptions of the foregoing embodiments, and details are not described herein again.

Accordingly, an organic light emitting diode display panel, a method of manufacturing thereof, and a display device are provided. It solves a problem, which is that the photoresist cannot be complete filled into the via hole in the subsequent DOT process, by adding a plurality of second banks in the via hole region of the substrate, and there is no need to add additional inkjet printing processes, so it further simplifies processes and reduces costs.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. A method of manufacturing an organic light emitting diode display panel, comprising following steps:
   providing a substrate, wherein a flexible film layer is formed on the substrate;
   forming an anode layer on the flexible film layer, wherein a via hole region is disposed on the anode layer, a camera is disposed at a side of the substrate facing away from the via hole region, and an orthographic projection region of the camera on the substrate is located in the via hole region;
   forming a plurality of first banks and a plurality of second banks at intervals in the via hole region, wherein the plurality of first banks and the plurality of the second banks are both located in the orthographic projection region of the via hole region;
   depositing a light emitting layer and a cathode layer on the anode layer sequentially, wherein the light emitting layer and the cathode layer are configured to form a light emitting unit; and
   packaging the display panel.

2. The method of manufacturing the organic light emitting diode display panel according to claim 1, wherein the plurality of first banks correspond to a position of a camera aperture in the orthographic projection region of the substrate, and the plurality of second banks are formed in the via hole region surrounded by the plurality of first banks.

3. The method of manufacturing the organic light emitting diode display panel according to claim 1, wherein a step of the packaging the display panel comprises:
   forming a first inorganic layer on the light emitting unit, the plurality of first banks, and the plurality of second banks, wherein grooves are formed at positions adjacent to the plurality of first banks and the plurality of second banks of the inorganic layer;
   forming a first organic layer on the first inorganic layer excluding the grooves; and
   forming a second inorganic layer on the first inorganic layer and the first organic layer.

4. The method of manufacturing the organic light emitting diode display panel according to claim 3, wherein the first inorganic layer and the second inorganic layer are formed by chemical vapor deposition.

5. The method of manufacturing the organic light emitting diode display panel according to claim 3, wherein the first organic layer is formed by inkjet printing.

6. The method of manufacturing the organic light emitting diode display panel according to claim 1, wherein a step of before forming the anode layer on the flexible film layer further comprises:
   forming an active layer, gate layer, and a source/drain layer on the substrate sequentially.

7. An organic light emitting diode display panel, comprising:
   a substrate, wherein a flexible film layer is formed on the substrate;
   a light emitting unit comprising an anode layer, a light emitting layer, and a cathode layer, wherein a via hole region is disposed on the anode layer, a camera is disposed at a side of the substrate facing away from the via hole region, and an orthographic projection region of the camera on the substrate is located in the via hole region;
   first banks and second banks, wherein the first banks and the second banks are formed at intervals in the via hole region, and the first banks and the second banks are both located in the orthographic projection region of the via hole region; and
   a packaging layer formed on the first banks, the second banks, and the light emitting unit,
   wherein the packaging layer comprises:
   a first inorganic layer formed on the light emitting unit, the first banks, and the second banks, wherein grooves are formed between the first banks and the second banks of the inorganic layer, and a groove is formed between two adjacent second banks of the inorganic layer;
   a first organic layer formed on the first inorganic layer; and
   a second inorganic layer formed on the first inorganic layer and the first organic layer,
   wherein the first organic layer is formed in the groove between the two adjacent second banks and is not formed in the grooves between the first banks and the second banks.

8. The organic light emitting diode display panel according to claim 7, wherein the plurality of first banks correspond to a position of a camera aperture in the orthographic projection region of the substrate, and the second bank is formed in the via hole region surrounded by the plurality of first banks.

9. A display device, comprising:

A display panel, wherein the display panel comprises:

a substrate, wherein a flexible film layer is formed on the substrate;

a light emitting unit comprising an anode layer, a light emitting layer, and a cathode layer, wherein a via hole region is disposed on the anode layer, a camera is disposed at a side of the substrate facing away from the via hole region, and an orthographic projection region of the camera on the substrate is located in the via hole region;

first banks and second banks, wherein the first banks and the second banks are formed at intervals in the via hole region, and the first banks and the second banks are both located in the orthographic projection region of the via hole region; and a packaging layer formed on the first banks, the second banks, and the light emitting unit, wherein the packaging layer comprises:

a first inorganic layer formed on the light emitting unit, the first banks, and the second banks, wherein grooves are formed between the first banks and the second banks of the inorganic layer, and a groove is formed between two adjacent second banks of the inorganic layer;

a first organic layer formed on the first inorganic layer; and a second inorganic layer formed on the first inorganic layer and the first organic layer, wherein the first organic layer is formed in the groove between the two adjacent second banks and is not formed in the grooves between the first banks and the second banks.

10. The display device according to claim 9, wherein the plurality of first banks correspond to a position of a camera aperture in the orthographic projection region of the substrate, and the second bank is formed in the via hole region surrounded by the plurality of first banks.

\* \* \* \* \*